United States Patent [19]

Sakamoto

[11] Patent Number: 5,043,941
[45] Date of Patent: Aug. 27, 1991

[54] NON-VOLATILE MEMORY
[75] Inventor: Makoto Sakamoto, Chiba, Japan
[73] Assignee: Kawasaki Steel Corporation, Hyogo, Japan
[21] Appl. No.: 467,390
[22] Filed: Jan. 19, 1990
[30] Foreign Application Priority Data
  Jan. 30, 1989 [JP] Japan .................................. 1-20086
[51] Int. Cl.$^5$ .............................................. G11C 11/40
[52] U.S. Cl. ................................. 365/185; 365/189.05
[58] Field of Search ........................... 365/185, 189.05; 357/23.5

[56] References Cited
U.S. PATENT DOCUMENTS

| | | | |
|---|---|---|---|
| 4,030,081 | 6/1977 | Horninger | 365/149 |
| 4,573,144 | 2/1986 | Countryman, Jr. | 365/185 |
| 4,788,663 | 11/1988 | Tanaka et al. | 365/185 |
| 4,829,203 | 5/1989 | Ashmore, Jr. | 365/185 |

FOREIGN PATENT DOCUMENTS 57-16747 4/1982 Japan .
59-29155 7/1984 Japan .

OTHER PUBLICATIONS

Sau-Ching Wong et al., "Novel Circuit Techniques for Zero-Power 25-ns CMOS Erasable Programmable Logic Devices (EPLD's)", Oct. 5, 1986, IEEE Journal of Solid-State Circuits, vol. SC-21, pp. 766∝774.
1985 IEEE International Solid-State Circuits Conf., Session XIII: Nonvolatile Memories, "THPM 13.2: A 100ns 256K CMOS EPROM", H. Gaw et al., pp. 164-165, attached FIGS. 4, 5, Table 1 (pp. 333-334).

Primary Examiner—James W. Moffitt
Attorney, Agent, or Firm—Oliff & Berridge

[57] ABSTRACT

A non-volatile memory provides a signal hold circuit which uses a FAMOS instead of an input transistor of a ratioed inverting amplifier and outputs a change in a threshold value of the FAMOS, for the purpose of reducing the number of elements of the signal hold circuit. FAMOSs for programming and latching are provided respectively, and the FAMOSs are interconnected to each other at their floating gate electrodes to isolate the signal hold circuit and a program circuit and hence prevent a DC current path from being formed between those two circuits, for the purpose of miniaturization of a memory cell.

10 Claims, 5 Drawing Sheets

NON-VOLATILE MEMORY

BACKGROUND OF THE INVENTION

1. Field of the Invention

The present invention relates to a non-volatile memory, and more specifically to a non-volatile memory suitable for use in an integrated circuit such as a programmable logic circuit and a programmable signal processing circuit, the integrated circuit being electrically programmed and determined in its configuration after being packaged.

2. Prior Art

EPROMs (Erasable Programmable Read-Only Memory) and EEPROMs (Electrically Erasable and Programmable Read-Only Memory) are known as non-volatile memory devices which are now most widely used.

These devices output partly enormous contents stored therein by exetrnal addressing. As illustrated in FIG. 6, a two-dimensional array 10 of a floating gate avalanche injection MOS FET (hereinafter, referred to as a FAMOS) includes and addressing decoder 12 and a selector 14 additionally to memory cells 10A, ..., 10N. The storage contents in the array is read out by previously providing electric charges to bit lines, selecting desired memory cells among the memory cells 10A, ..., 10N, and imparting dynamical binary states to those bit lines, and further amplifying those states by an inverting amplifier 16 for example. While in storage of specifications of a logic circuit, e.g., a state of selection in the selector 14, all memory cells must hold a digital signal statically. Accordingly, in this case, memory cells, that do not allow dynamical read-out as just mentioned, are not useable. An additional circuit is neccessary, which converts the status of an EPROM cell or an EEPROM cell to a static voltage signal by any method.

Such a method of fully statically holding a digital signal using a FAMOS is disclosed in H. Gaw et. al., "A 100 ns 256K CMOS EPROM" ISSCC Dig. Tech. Papers, Feb. 1985, PP. 164–165, and in Saw-Ching Wong et al., "Novel circuit techniques for zero-power 25 ns CMOS erasable programmable logic device (EPLDs)" IEEE J. Solid-State Circuits. Vol. sc-21, No. 5 Oct. 1986.

The disclosed device basically includes as illustrated in FIG. 7, a latch 20, signal hold nodes Q, QN of the latch 20 and FAMOSs 22, 24 for switching to ground, the FAMOSs determining a signal voltage held in the latch 20 by being injected with electrons into floating gates thereof. More specifically, if electrons are injected into the floating gate only of the FAMOS 22, then the signal hold node Q holds a high level signal, while if electrons being injected into that only of the FAMOS 24, then the signal hold node Q holds a low level signal. In contrast, in a programmable signal processing device, a latch and a FAMOS array are independently arranged, the FAMOS array, which is similar to a typical EPROM device, is dynamically read out upon the initial stage of its operation, and data so read out is held by another latch.

Herein, when a FAMOS, which has been incorporated into a circuit instead of being array-shaped, is to be programmed, it is effectual to devise the circuit such that no high tension voltage is applied to peripheral circuit components of the FAMOS. One of such methods is disclosed in Japanese Patent Publication No. 57-16747, wherein floating gates of a plurality of FAMOSs are connected to a gate of an FET, and hot electrons produced in a channel region of the FET are injected into the floating gates of the FAMOSs.

Additionally, also for the typical array construction, Japanese Patent Publication No. 59-29155 discloses another technique where two FAMOSs for only programming and reading out, respectively, with their floating gates connected to each other are used to optimize respective device structures with respect to their operations, and assure high speed operation.

However, the aforementioned method, in which the non-volatile memory and the latch were separately disposed, are not of a general purpose type because the FAMOS array is dynamically read out at the initial stage of operation and hence additional time is required to some degree for operating the integrated circuit.

Furthermore, in the aforementioned fully static non-volatile memory, there are required many elements for one memory cell and high tension voltage is exerted on the signal hold nodes Q, QN shown in FIG. 7 for programming of the memory, so that all the involved elements must have a structure to withstand high voltage.

Owing to the reasons described above, every methods suffer from a very large area occupied by the memory cell which in turn hinders high integration of the device.

SUMMARY OF THE INVENTION

In view of the drawbacks of the prior arts, it is an object of the present invention to provide a non-volatile memory for an integrated circuit which has a reduced area and which is capable of high integration.

To achieve the above object, a non-volatile memory according to the present invention comprises: (a) a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrods of said latching field effect transistor, said signal hold circuit further holding a binary signal in a non-volatile and fully statical manners against the interruption of the power supply; (b) a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region.

In the non-volatile memory in accordance with one aspect of the present invention, said latching field effect transistor and said programming field effect transistor are interconnected to each other at control gates thereof and are earthened at source regions thereof, the drain region of said latching field effect transistor being connected to a first terminal of said load element, and said load element being connected to the power supply at a second terminal thereof different from said first terminal.

In the non-volatile memory in accordance with another aspect of the present invention, said latching field effect transistor has a structure to restrict hot electrons produced in a channel region thereof.

In the non-volatile memory in accordance with still another aspect of the present invention, said latching field effect transistor has a structure to restrict injection of the hot electrons produced in the channel region thereof into the floating gate electrode thereof.

In the non-volatile memory in accordance with further another aspect of the present invention, said latching field effect transistor has a structure to reduce a leakage current produced between the source and the drain thereof or between the drain and a body in order to reduce a power consumption.

To achieve the above object, the present invention first provides the signal hold circuit which employs a floating gate electrode field effect transistor, e.g., a FAMOS instead of an input transistor of a ratioed inverting amplifier and outputs a change in a threshold of the FAMOS, the number of elements of the signal hold circuit is reduced to the utmost to miniaturize a memory cell.

If there is any element, to which high tension voltage upon programming is applied, other than the aforementioned field effect transistor, the element must be constructed to withstand the high voltage, resulting in an increased occupation area thereof. Additionally, if there is any element connected in series to the drain region of the aforementioned field effect transistor, a large current is needed to flow therethrough upon programming, resulting in an increased area of the circuit. In accordance with the present invention, a floating gate field effect transistor, e.g., a FAMOS is employed for programming apart from one for latching. At least floating gate electrodes of the two field effect transistors are interconnected to each other to isolate the signal hold circuit and the program circuit and hence have no DC current path between the two circuits.

Herein, since the signal hold circuit is not a complete CMOS construction according to the present invention, there is existent a DC path upon latching and it is feared that undesirable write occurs when a soft write resistance of the FAMOS is low. The reason is that there is produced hot electrons ⊖ in the vicinity of the drain D owing to a concentrated electric field, as illustrated in FIG. 2 for example. In FIG. 2, designated at B is a substrate, S is a source, C is a channel region, G is a control gate, and FG is a floating gate.

However, according to the present invention, since the programming and latching FAMOSs are isolated, the above difficulty can be avoided by imparting to the latching FAMOS a structure to prevent any hot electron from being produced in the channel region C, a structure to prevent the hot electron from being injected into the floating gate electrode FG or/and a structure to reduce a leakage current flowing between the drain D and the source S or between the drain D and a body.

To assure the structure to prevent the production of any hot electron, there is considered for example a structure where the channel length L of the latching FAMOS (refer to FIG. 2) is larger than that of the programming FAMOS to reduce the concentration of the electric field in the vicinity of the drain thereof, or a structure where impurity concentration (amount of doping) in the channel region C of the latching FAMOS is more reduced than that of the programming FAMOS to moderate the concentration of an electric field in the channel region C, or the so-called LDD structure is adopted as the latching FAMOS, where, as illustrated in FIG. 3 for example, second conductivity type (N⁻ in the figure) regions S', D' with lower concentration than second conductivity type (N⁺ in the figure) source and drain regions S, D is formed on the surface of a first conductivity type (P⁻ in the figure) substrate B in contact with the channel region C to establish a gentle slope impurity distribution in the vicinity of the drain and moderate the concentration of an electric field existent in the drain region.

To realize the structure for preventing any hot electron from being injected into the floating gate, there is useable, as illustrated in FIG. 4 for example, a structure where the thickness $t_1$ of an insulating layer $I_1$ located between the floating gate FG and the control gate G of the latching FAMOS is greater than the thickness $t_2$ of an insulating layer $I_2$ located between the floating gate FG and the channel region C, or a structure whire a dielectric constant of the aforementioned insulating layer $I_1$ of the latching FAMOS is more reduced than that of the aforementioned insulating layer $I_2$, or a structure where opposed area of the floating gate electrode and control gate electrode of the latching FAMOS is more reduced than that of the floating gate electrode and the channel region.

Additionally, reduction of any drain leakage is very effective to reduce power consumption of the circuit. This is realizable by adopting the aforementioned LDD structure for example as the latching FAMOS to moderate the concentration of the electric field produced in the vicinity of the drain.

With the present invention, as described above, the signal hold circuit with a less element number is employed and isolated from the program circuit to prevent any DC current path from being formed between those two circuits. Hereby, the same capability (holding any information in non-volatile and fully statical manners) as in the conventional latching system can be established on a remarkably reduced silicon chip area. Furthermore, the programming device is isolated from the latching device so that characteristics of the respective devices can be optimized for programming and latching.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENT

In what follows, a preferred embodiment of the present invention will be described with reference to the accompanying drawings.

Figure 1:
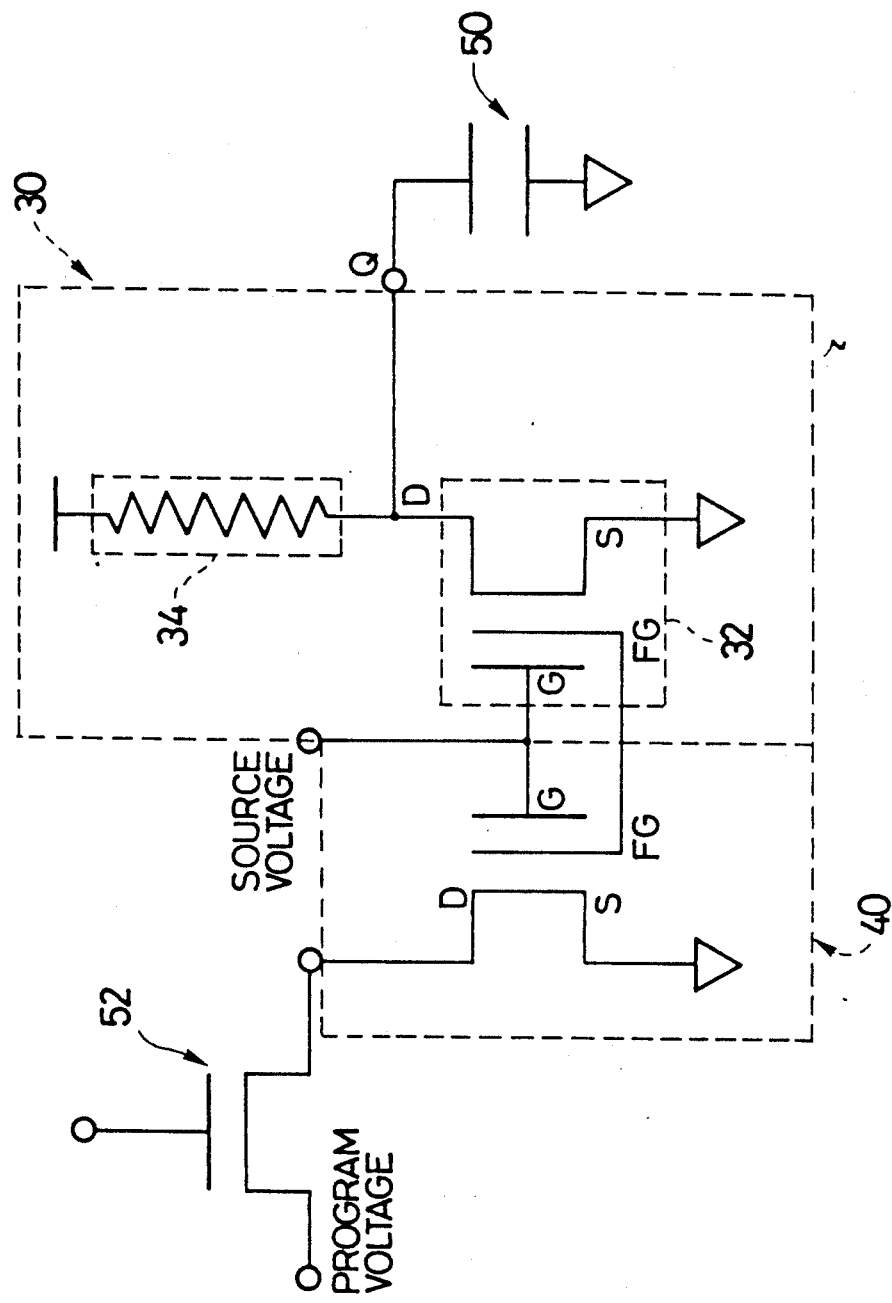
FIG. 1 is a circuit diagram illustrating a preferred embodiment of the present invention.

Referring to FIG. 1 illustrating the embodiment, a signal hold circuit 30 employs a latching FAMOS 32 instead of an input element of a general inverting amplifier. The signal hold circuit 30 is to amplify a threshold voltage of the FAMOS 32 instead of an ordinary input voltage by exerting a power supply voltage on a control gate electrode G of the same. Specifically, it outputs a low level voltage when the threshold voltage is low while outputting a high level voltage when the same is high. The present embodiment incorporates a resistor 34 as a load element which may be replaced by an active load.

In writing any signal into the latching FAMOS 32, there is required a switching element for switching a signal hold node Q and a program voltage supply circuit in order to exert the program voltage on a drain region D of the FAMOS 32. The switching element requires a large current drive capability and hence a remarkably increased area of the entire memory cell. To solve this difficulty, the present invention employs a program circuit comprising another FAMOS 40, interconnects floating gates FGs of the FAMOSs 32 and 40, and excerts a program voltage on a drain region D of the programming FAMOS 40 in writing. Hereby, there is required no element which is in need of a large current drive capability, to greatly reduce an occupation area of the circuit. The programming FAMOS 40 is also useable for read operation.

Figure 2:
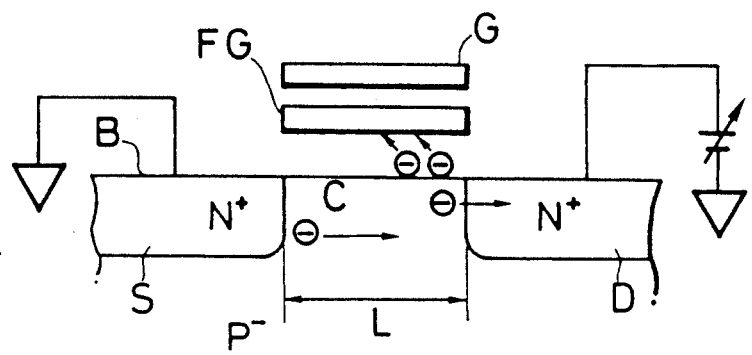
FIG. 2 is a sectional view illustrating a situation where hot electrons are produced in the vicinity of a drain owing to a concentrated electric field.
Figure 3:
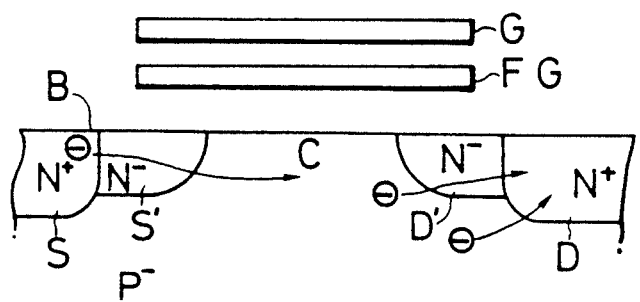
FIG. 3 is a diagram illustrating an LDD structure where the hot electrons are prevented from being produced together with prevention of any leakage.
Figure 4:
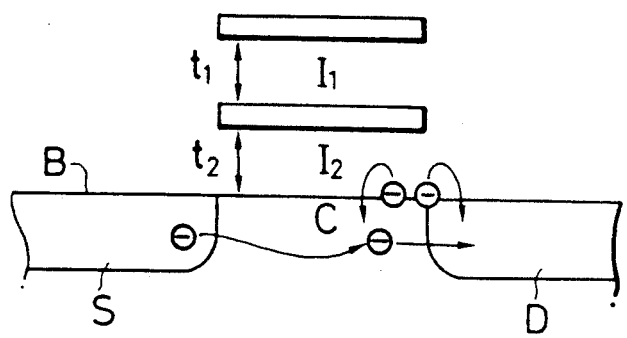
FIG. 4 is a diagram illustrating a structure where the hot electrons are prevented from being injected.

Herein, if soft write resistance of a FAMOS has any problem in view of the element and circuit characteristics, the latching FAMOS 32 may additionally include a structure which can prevent any hot electron from being produced or prevent any hot electron from being injected into a floating gate of the FAMOS or prevent a drain leakage current from being produced. To be concrete, there can be considered countermeasures, as described with reference to FIG. 2, wherein a gate length is made longer; impurity concentration of the channel is reduced; such an LDD structure as shown in FIG. 3 is adopted; and capacitance between the floating gate and the control gate is reduced together with reduction of the thickness, quality (dielectric constant), and opposed area of the insulating layer. Additionally, the aforementioned LDD structure can serve to reduce power consumption because of its prevention of any drain leakage.

Furthermore, if there is a problem in view of holding electric charges like a soft error on the FAMOS as a memory circuit, a proper capacitor 50 for assisting signal storage may additionally be incorporated between the signal hold node Q and the ground as shown in the FIG. 1. Moreover, a switching element 52 may be incorporated in series to the programming FAMOS 40, depending upon the characteristics of the same. This may be the case in particular when the FAMOS 40 is replaced by a FLOTOX type cell.

In accordance with the present invention, the signal hold circuit 30 with a less element number is employed and the signal hold circuit 30 is isolated from the program circuit 40 to prevent a DC current path from being formed between those two circuits. The invention can therefore realize the same function (holding a signal in non-volatile and fully static manners) as the conventional latching system on a silicon chip area 1/5 times or less (same technology ratio) of the conventional system.

Figure 5A:
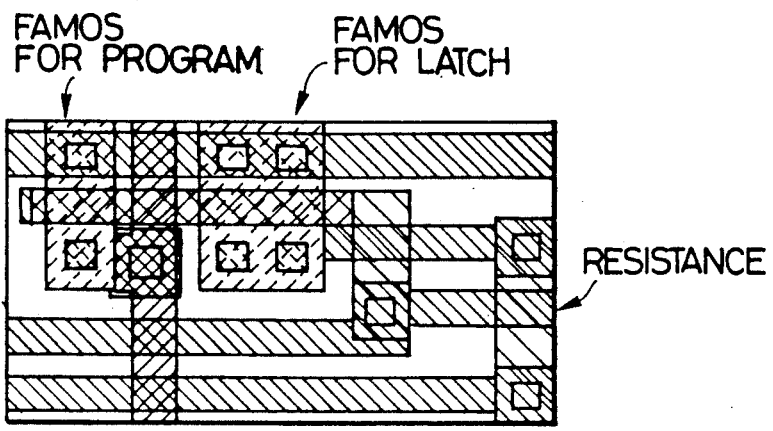
FIG. 5A and 5B are plan views each illustrating in comparison layouts of the circuit of FIG. 1 and a circuit of FIG. 7 designed with the same technology.
Figure 5B:
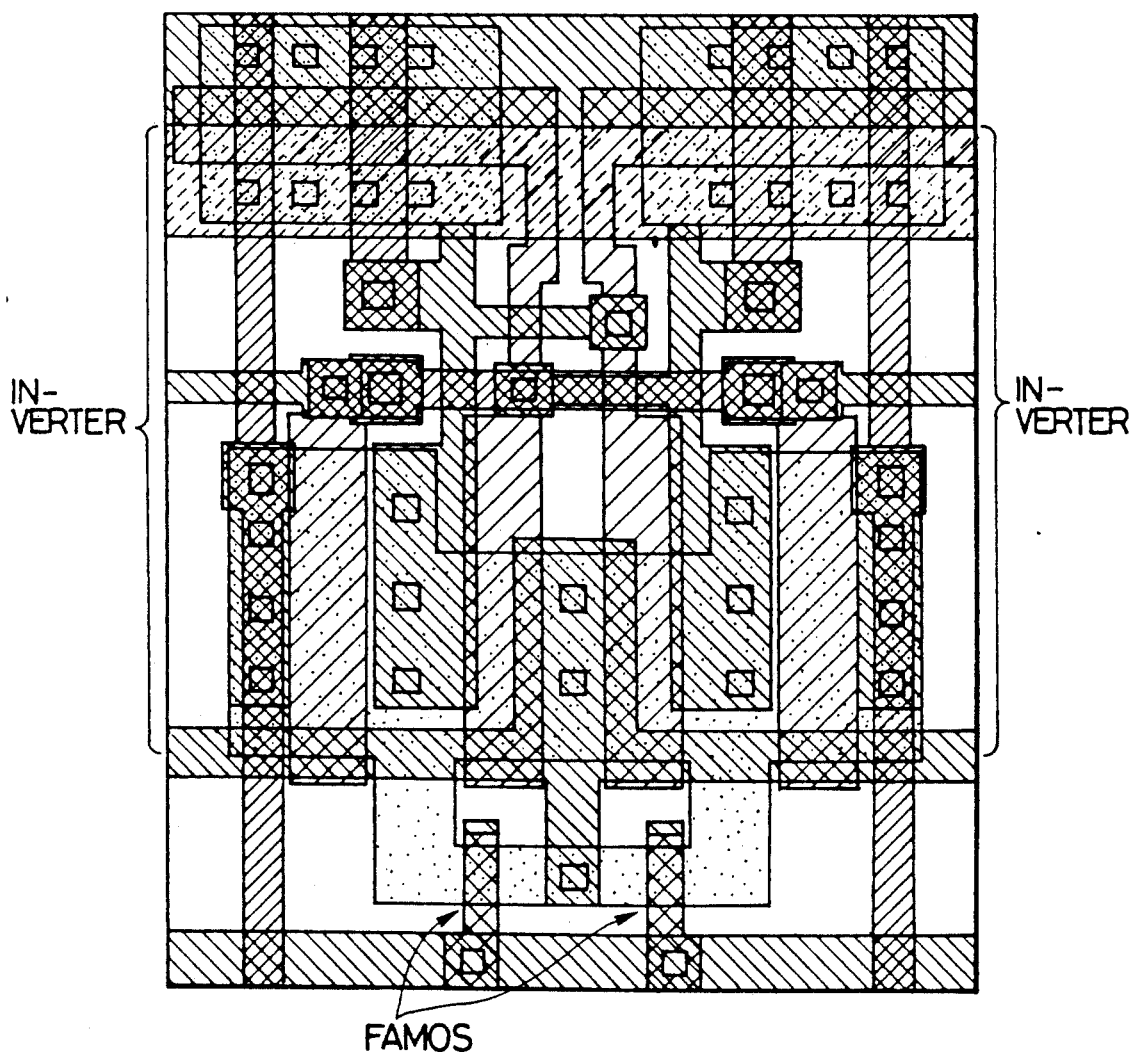
Figure 6:
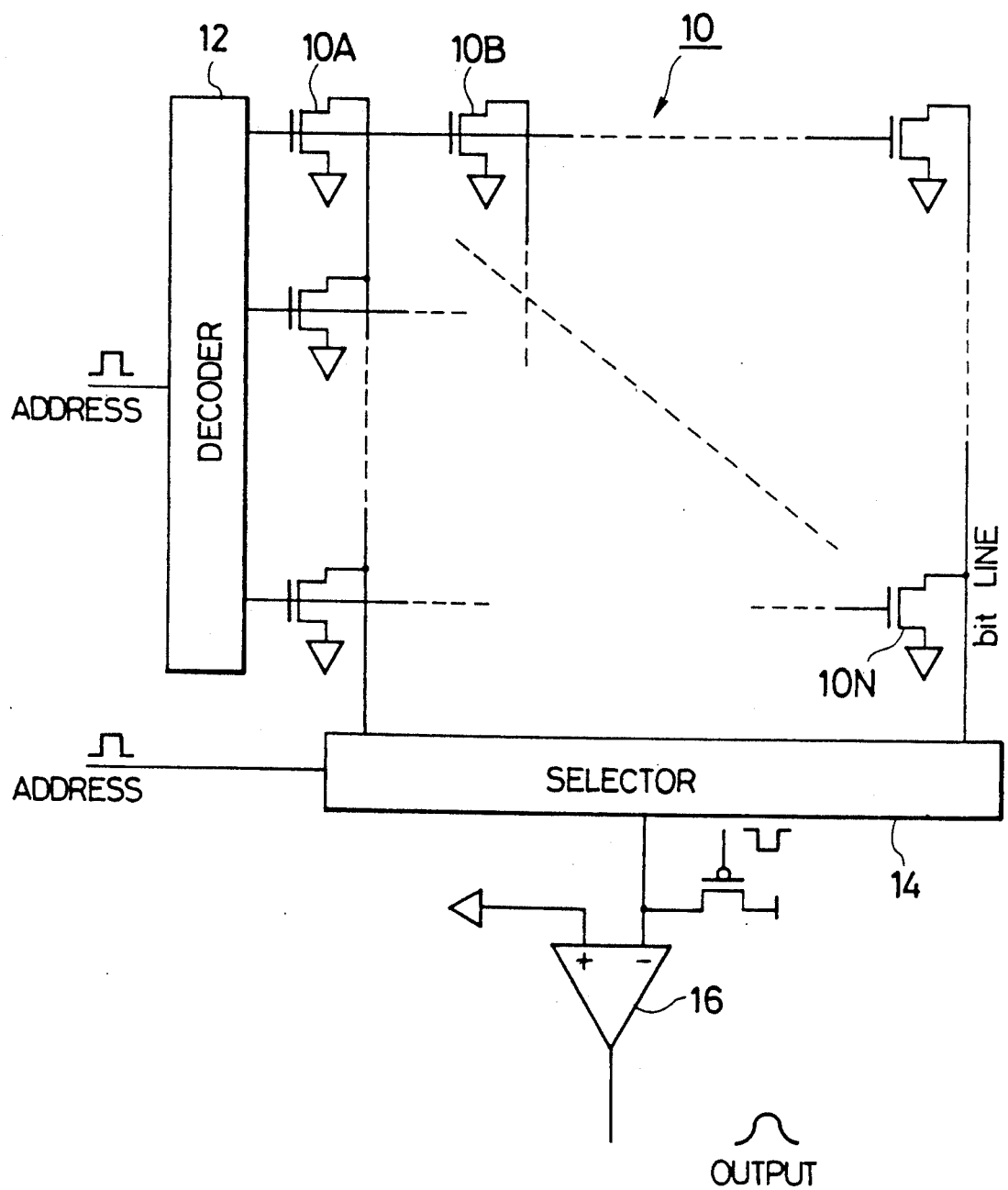
FIG. 6 is a circuit diagram illustrating a manner of an EPROM where it outputs data.
Figure 7:
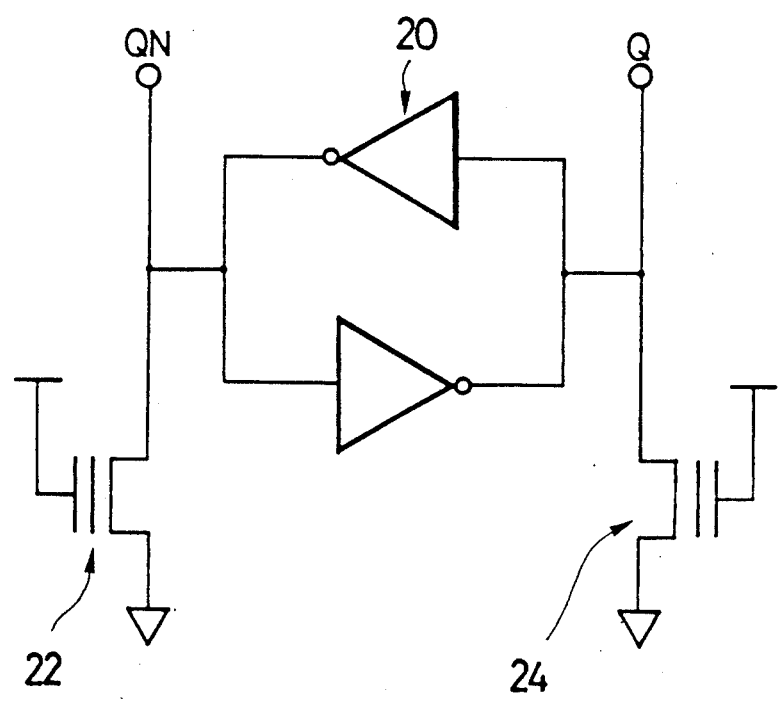
FIG. 7 is a circuit diagram illustrating a conventional latching type signal hold circuit.

Referring here to FIG. 5A and 5B, exemplary layouts of the circuit of the present invention (FIG. 5A) and the conventional circuit (FIG. 5B) shown in FIG. 7, being designed under the same process technology, is illustrated for comparison.

Although in the present embodiment the present invention was incorporated in the programmable logic circuit, the present invention may be applicable without limitation thereto. For example, the present invention is also applicable to an application in a redundant circuit technique in which any large capacity memory with any failure is replaced by a spare one, and allocation of the spare one is stored.

What is claimed is:

1. A non-volatile memory comprising:
   a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply and;
   a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region.

2. A non-volatile memory according to claim 1 wherein said programming field effect transistor additionally includes a switching element connected in series thereto.

3. A non-volatile memory according to claim 1, wherein the non-volatile memory is coupled to an integrated circuit.

4. An integrated circuit including a non-volatile memory, characterized in that the non-volatile memory comprises:
   a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manners against the interruption of the power supply;
   a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region.

5. A non-volatile memory comprising:
a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply; and a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region, said latching field effect transistor and said programming field effect transistor being connected to each other at their control gate electrodes and being earthened at their source regions, the drain region of said latching field effect transistor being connected to a first terminal of said load element, said load element being connected to the power supply at a second terminal thereof different from said first terminal.

6. A non-volatile memory comprising:
a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply; and a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region, said latching field effect transistor having a structure to prevent hot electrons from being produces in a channel region thereof.

7. A non-volatile memory comprising:
a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply; and a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region, said latching field effect transistor having a structure to prevent hot electrons produces in a channel region thereof from being injected into the floating gate electrode thereof.

8. A non-volatile memory comprising:
a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply; and a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region, said latching field effect transistor having a structure to reduce a leakage current produced between a source and the drain thereof or between the drain thereof and a body.

9. A non-volatile memory comprising:
a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply; and a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region, said latching field effect transistor being of an LDD structure which has second conductivity type regions with lower concentration than second conductivity type source and drain regions on the surface of a first conductivity type substrate making contact with the channel region thereof.

10. A non-volatile memory comprising:

a signal hold circuit including at least an electrically programmable field effect transistor provided with a latching floating gate electrode and a load element, said signal hold circuit being operational to amplify the threshold voltage of said latching field effect transistor by exerting a power supply voltage on a control gate electrode of said latching field effect transistor, said signal hold circuit further holding a binary signal in a non-volatile and fully static manner against the interruption of the power supply; and a program circuit including at least a programming field effect transistor provided with a floating gate electrode, said floating gate electrode being connected at least to said floating gate electrode of said latching field effect transistor of said signal hold circuit, said program circuit having no DC current path between itself and said signal hold circuit and writing any information in a drain region of said programming field effect transistor by exerting a program voltage on said drain region, said signal hold circuit additionally including a capacitor for assisting an information storing action between a signal hold node and the ground.

* * * * *